(12) United States Patent
Tang

(10) Patent No.: US 9,173,328 B2
(45) Date of Patent: Oct. 27, 2015

(54) HEAT DISSIPATION SYSTEM AND RACK-MOUNT SERVER USING THE SAME

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Xian-Xiu Tang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 329 days.

(21) Appl. No.: 13/901,594

(22) Filed: May 24, 2013

(65) Prior Publication Data

US 2014/0332184 A1 Nov. 13, 2014

(30) Foreign Application Priority Data

May 9, 2013 (CN) .......................... 2013 1 0168588

(51) Int. Cl.
*H05K 7/20* (2006.01)
*H01L 23/473* (2006.01)

(52) U.S. Cl.
CPC .................................. *H05K 7/20781* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467

USPC ........................ 361/676–678, 679.46–679.54, 361/688–723, 699–704, 709–710, 361/719–721; 165/80.1–80.5, 104.33, 185; 174/15.1–15.3, 16.1–16.3, 547, 548; 257/712–722, E23.088; 24/453, 24/458–459; 454/184

See application file for complete search history.

(56) References Cited

U.S. PATENT DOCUMENTS

| | | | |
|---|---|---|---|
| 6,955,212 B1 * | 10/2005 | Hsieh ........................... | 165/80.4 |
| 2003/0016498 A1 * | 1/2003 | Kurokawa et al. ............. | 361/699 |
| 2003/0066638 A1 * | 4/2003 | Qu et al. ........................ | 165/186 |
| 2005/0138944 A1 * | 6/2005 | Gwin et al. .................. | 62/259.2 |
| 2005/0178528 A1 * | 8/2005 | Ohashi et al. ................. | 165/80.3 |
| 2005/0180105 A1 * | 8/2005 | Matsushima et al. ......... | 361/699 |
| 2006/0185378 A1 * | 8/2006 | Duan et al. ................... | 62/259.2 |
| 2007/0023169 A1 * | 2/2007 | Mahalingam et al. ... | 165/104.28 |
| 2007/0297138 A1 * | 12/2007 | Huang et al. .................. | 361/699 |
| 2008/0030956 A1 * | 2/2008 | Silverstein et al. ........... | 361/700 |
| 2008/0314559 A1 * | 12/2008 | Hsu et al. ..................... | 165/80.4 |
| 2009/0000773 A1 * | 1/2009 | Levy ........................ | 165/104.34 |
| 2009/0244830 A1 * | 10/2009 | Wyatt et al. .............. | 361/679.47 |
| 2010/0044016 A1 * | 2/2010 | Frey et al. ................ | 165/104.33 |
| 2010/0073866 A1 * | 3/2010 | Toyoda et al. ........... | 361/679.47 |

(Continued)

*Primary Examiner* — Anthony Haughton
*Assistant Examiner* — Razmeen Gafur
(74) *Attorney, Agent, or Firm* — Novak Druce Connolly Bove + Quigg LLP

(57) ABSTRACT

A heat dissipation system includes a chassis, a number of heat absorbing boxes, a number of pipes, a first water tank and a second water tank received in the chassis, a number of fins sandwiched between the first water tank and the second water tank, a number of fans aligning with the fins, and a water pump connected between the first water tank and the second water tank. Each heat absorbing box includes a water inlet and a water outlet, and heat from electrical components is gathered by the boxes, transferred to the water tanks, and the fans blow air through the fins to dissipate the gathered heat.

16 Claims, 5 Drawing Sheets

(56) References Cited

U.S. PATENT DOCUMENTS

| | | |
|---|---|---|
| 2010/0118494 A1* | 5/2010 | Campbell et al. .............. 361/701 |
| 2010/0321880 A1* | 12/2010 | Yeo et al. .................. 361/679.46 |
| 2010/0328892 A1* | 12/2010 | Madison et al. .............. 361/702 |
| 2011/0176273 A1* | 7/2011 | Olsen et al. .............. 361/679.47 |
| 2011/0185758 A1* | 8/2011 | Shimokawa et al. ......... 62/259.2 |
| 2011/0222246 A1* | 9/2011 | Hsieh et al. .................... 361/720 |
| 2011/0255237 A1* | 10/2011 | Doll .......................... 361/679.46 |
| 2011/0292600 A1* | 12/2011 | Campbell et al. ............. 361/691 |
| 2011/0317365 A1* | 12/2011 | Tang ............................. 361/699 |
| 2012/0255711 A1* | 10/2012 | Andres .................... 165/104.31 |

\* cited by examiner

HEAT DISSIPATION SYSTEM AND RACK-MOUNT SERVER USING THE SAME

BACKGROUND

1. Technical Field

The present disclosure relates to a rack-mount server with a heat dissipation system.

2. Description of Related Art

An ordinary rack-mount server includes a plurality of server units generating a large amount of heat in operation. If the heat is not removed rapidly, it will cause damage to the server units. Typically, the heat is dissipated out of the rack-mount server by the system fans. However, dissipating heat by the system fans is slow and inefficient.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean "at least one."

Figure 1:
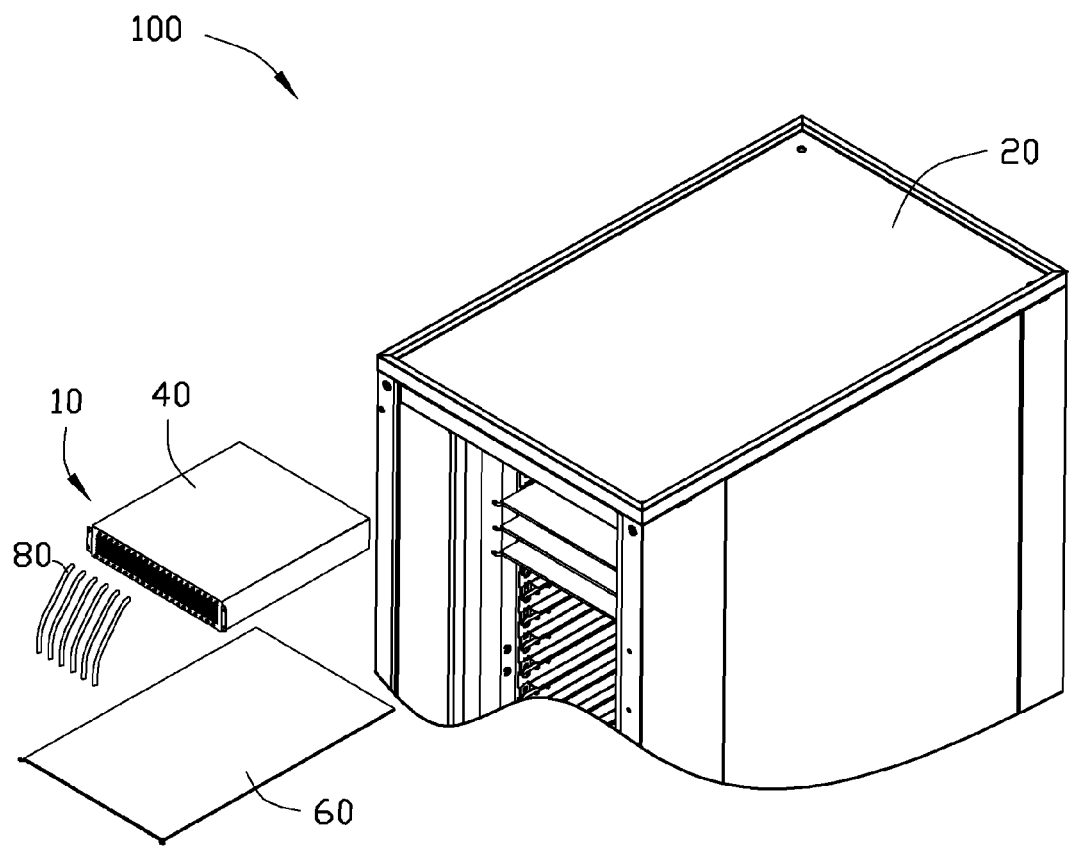
FIG. 1 is an isometric, exploded view of an embodiment of a rack-mount server, wherein the rack-mount server includes a heat dissipation device and a plurality of heat absorbing boxes.

FIG. 1 shows an embodiment of a rack-mount server 100. The rack-mount server 100 includes a rack 20 and a heat dissipation system 10. The heat dissipation system 10 includes a heat dissipation device 40, a plurality of heat absorbing boxes 60, and a plurality of water pipes 80.

Figure 2:
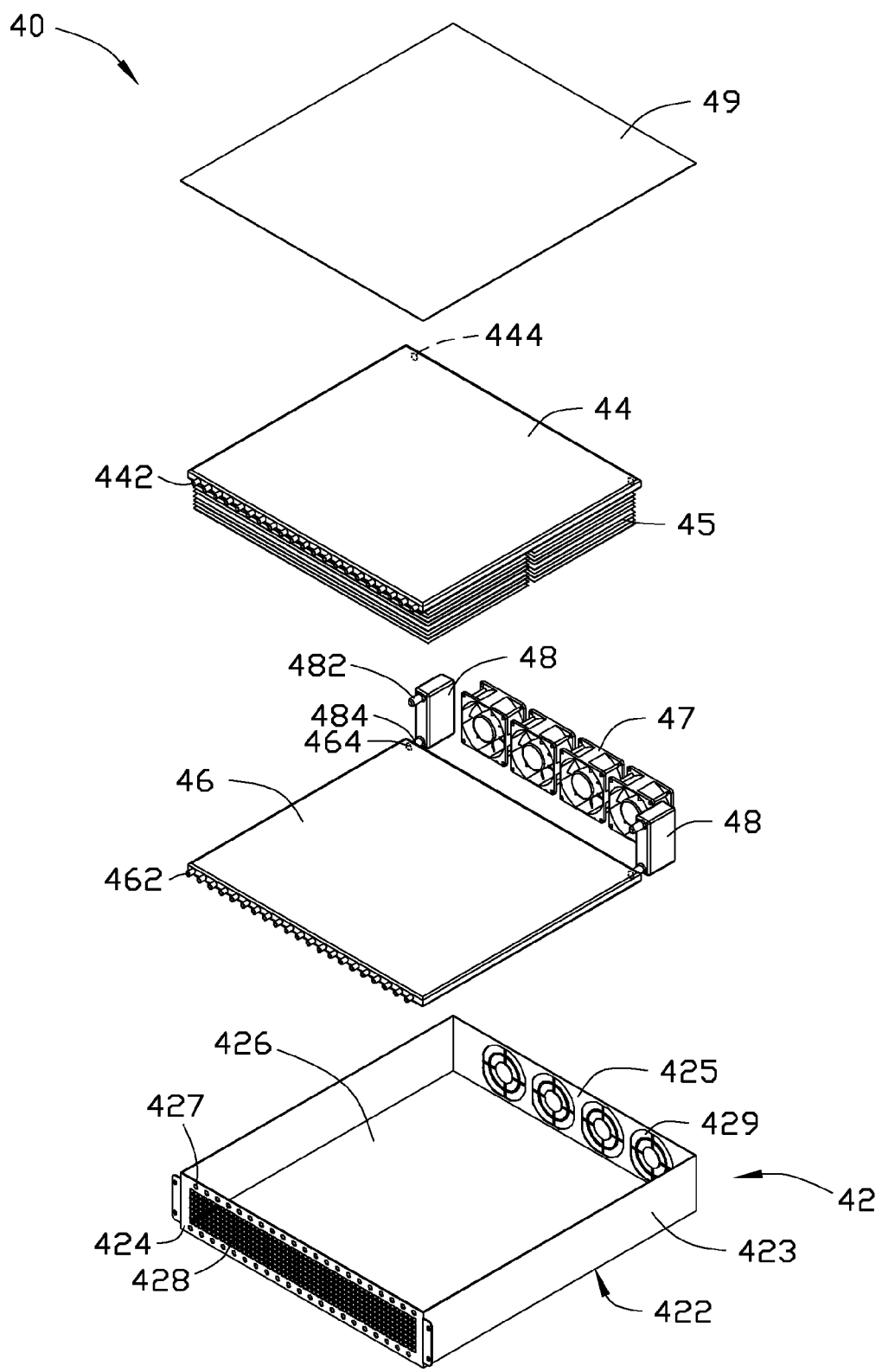
FIG. 2 is an exploded, enlarged, isometric view of the heat dissipation device of FIG. 1.

FIG. 2 shows the heat dissipation device 40 including a chassis 42, a first water tank 44, a second water tank 46, a plurality of fins 45, a plurality of fans 47, two water pumps 48, and a cover 49.

The chassis 42 includes a rectangular bottom plate 422, two side plates 423 perpendicularly extending up from two opposite sides of the bottom plate 422, a front end plate 424 perpendicularly extending up from a front end of the bottom plate 422 and connected between front ends of the side plates 423, and a rear end plate 425 perpendicularly extending up from a rear end of the bottom plate 422 and connected between rear ends of the side plates 423. The bottom plate 422, the side plates 423, the front end plate 424, and the rear end plate 425 cooperatively bound a receiving space 426. An upper and a lower portions of the front end plate 424 define two rows of through holes 427 arrayed in a lengthwise direction of the front end plate 424. A middle portion of the front end plate 424 defines a plurality of ventilation holes 428. The rear end plate 425 defines a plurality of air ventilation areas 429 in a middle of the rear end plate 425, opposite to the ventilation holes 428.

The first water tank 44 is hollow and rectangular. A row of inlet pipes 442 protrudes forward from an upper portion of a front side of the first water tank 44, and communicates with an inner space of the first water tank 44. Two ends of a rear side of the first water tank 44 define two water outlets 444. The first water tank 44 is made of heat-conductive material.

The second water tank 46 is hollow and rectangular. A row of outlet pipes 462 protrudes forward from a front side of the second water tank 46, and communicates with an inner surface of the second water tank 46. Two ends of a rear side of the second water tank 46 define two water inlets 464. The second water tank 46 is made of heat-conductive material.

The fins 45 are mounted on a bottom of the first water tank 44, and are made of heat-conductive material.

Each water pump 48 includes a water inlet pipe 482 and a water outlet pipe 484.

Figure 3:
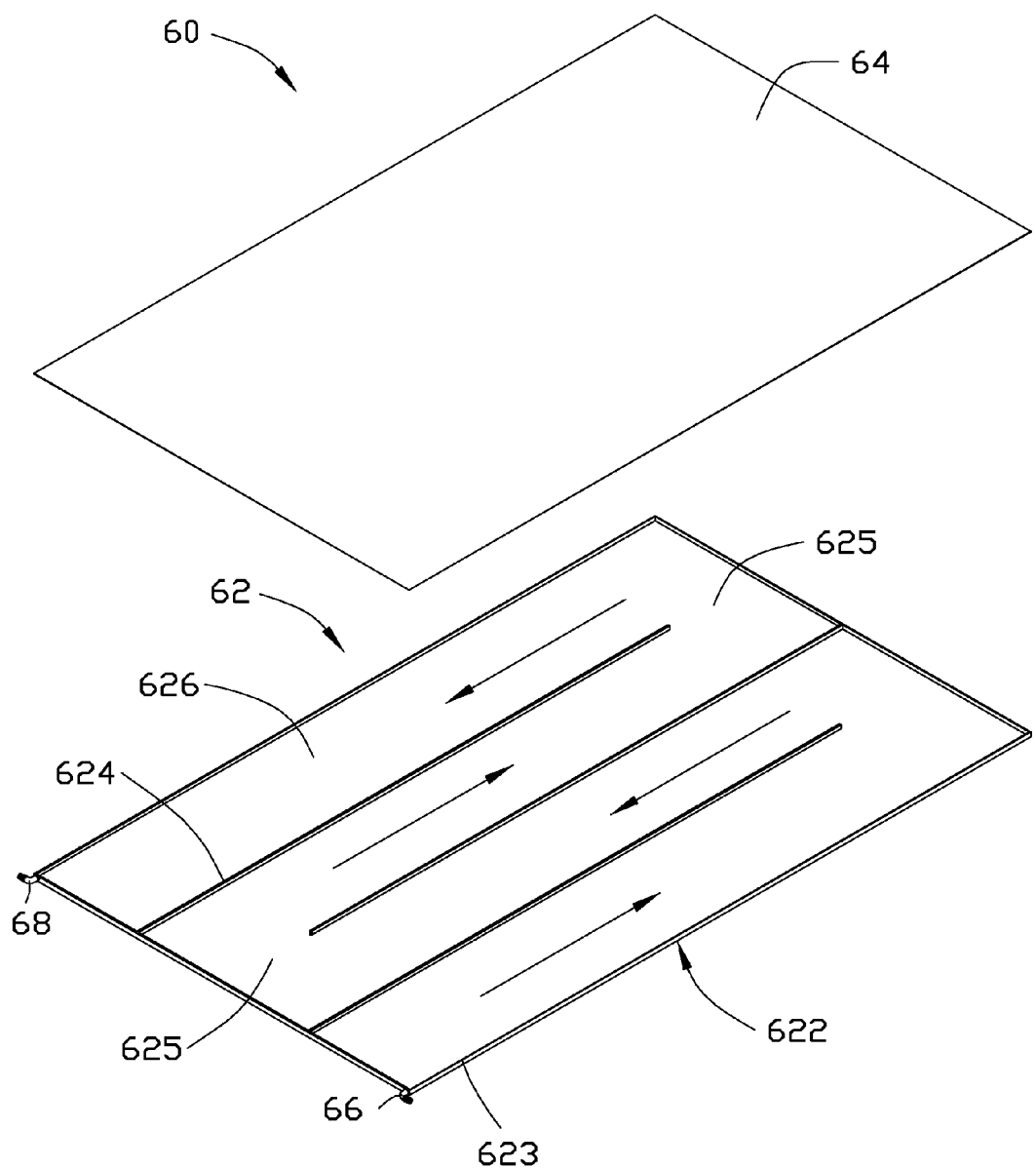
FIG. 3 is an exploded, isometric view of the heat absorbing box of FIG. 1.

FIG. 3 shows each heat absorbing box 60 including a shell 62, a cover 64, a water inlet connector 66, and a water outlet connector 68. The shell 62 includes a rectangular bottom plate 622, a flange 623 protrudes up from four sides of the bottom plate 622, and a plurality of spaced partition bars 624 protrude up from the bottom plate 622. An end of each partition bar 624 defines a cutout 625. The cutouts 625 of every two adjacent partition bars 624 are defined in opposite ends of the partition bars 624. Thus, the flange 623 and the partition bars 624 cooperatively bound a water slot 626. The water inlet connector 66 and the water outlet connector 68 are mounted on two ends of a front end of the shell 62, and communicate with two opposite ends of the water slot 626. Each heat absorbing box 60 is made of heat-conductive material.

In assembly of the heat dissipation device 40, a bottom of the fins 45 opposite to the first water tank 44 is supported on the second water tank 46, with the inlet pipes 442 of the first water tank 44 located at the same side as the outlet pipes 462 of the second water tank 46. The water inlet pipes 482 of the water pumps 48 are inserted into the water outlets 444 of the first water tank 44, and the water outlet pipes 484 of the water pumps 48 are inserted into the water inlets 464 of the second water tanks 46. A combination of the first water tank 44, the second water tank 46, the fins 45, and the water pumps 48 is received in the receiving space 426 of the chassis 42, to allow the insertion of the inlet pipes 442 of the first water tank 44 and the outlet pipes 462 of the second water tank 46 into the through holes 427 of the chassis 42. The fans 47 are received in the receiving space 426 and mounted to the rear end plate 425, with the fans 47 located between the air ventilation areas 429 and the fins 45. The cover 49 is mounted on a top of the chassis 42. Therefore, the fins 45 are sandwiched between the first water tank 44 and the second water tank 46, and are located between the ventilation holes 428 of the front end plate 424 and the fans 47.

In assembly of each heat absorbing box 60, the cover 64 is hermetically mounted on the flange 623 of the shell 62, opposite to the bottom plate 622.

Figure 4:
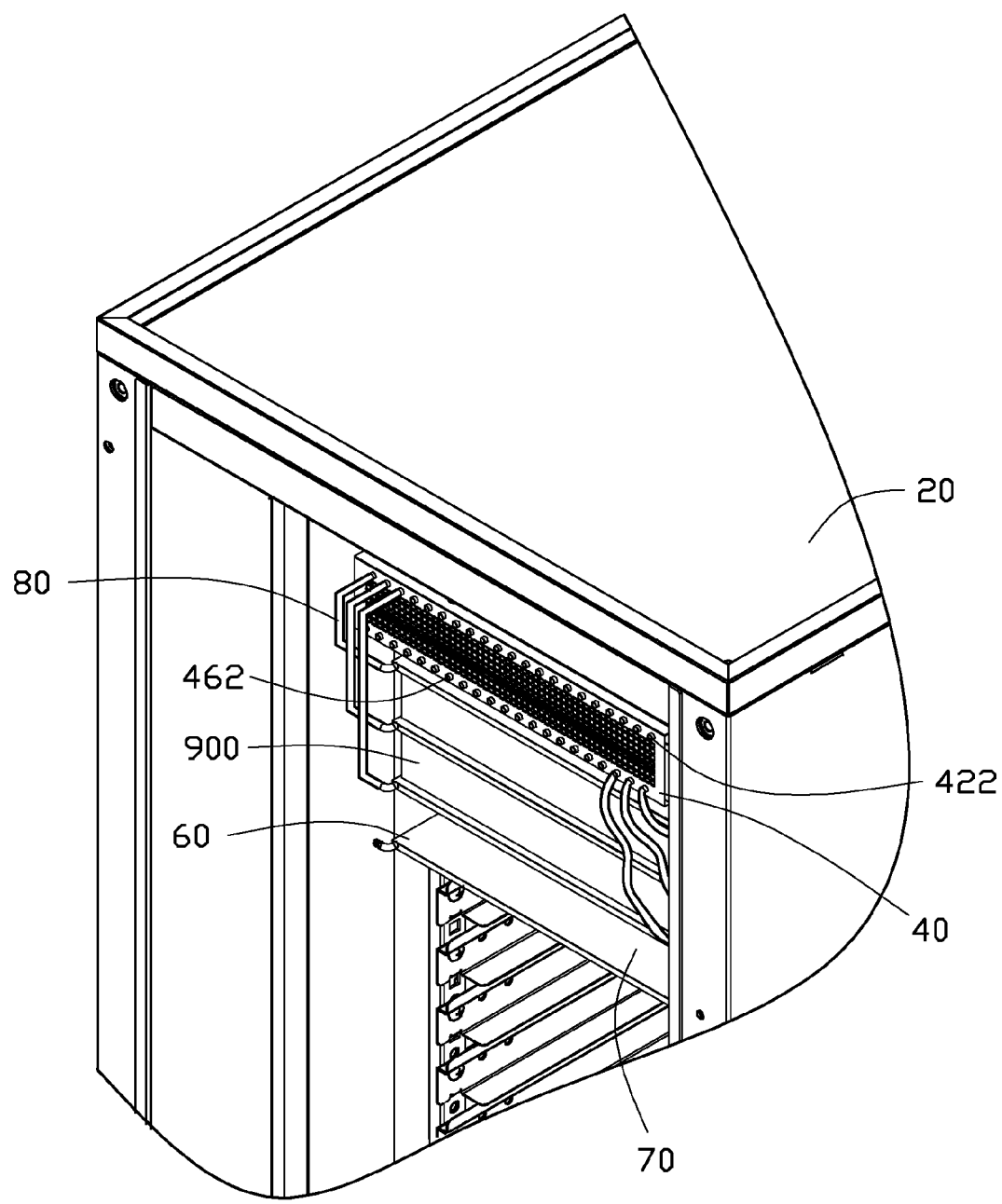
FIG. 4 is an assembled, isometric view of the rack-mount server of FIG. 1.

FIG. 4 shows assembly of the rack-mount server 100. The heat dissipation device 40 is inserted into an upper portion of a front part of the rack 20, and mounted to the rack 20. Rear ends of the heat absorbing boxes 60 are inserted into the rack 20 from the front of the rack 20, below the heat dissipation device 40, and mounted to the rack 20. A space 70 is bounded between every two adjacent heat absorbing boxes 60. The water inlet connectors 66 and the water outlet connectors 68 are located at the same side as the inlet pipes 442 and the outlet pipes 462. A plurality of server units 900 is inserted into the rack 20, with each server unit 900 tightly sandwiched between two adjacent heat absorbing boxes 60. Ends of some water pipes 80 are connected to the inlet pipes 442 of the first water tank 44, and opposite ends of the some water pipes 80 are connected to the water outlet connectors 68 of the heat absorbing boxes 60. Ends of the remaining water pipes 80 are connected to the outlet pipes 462 of the second water tank 46, and opposite ends of the remaining water pipes 80 are connected to the water inlet connectors 66 of the heat absorbing boxes 60.

Figure 5:
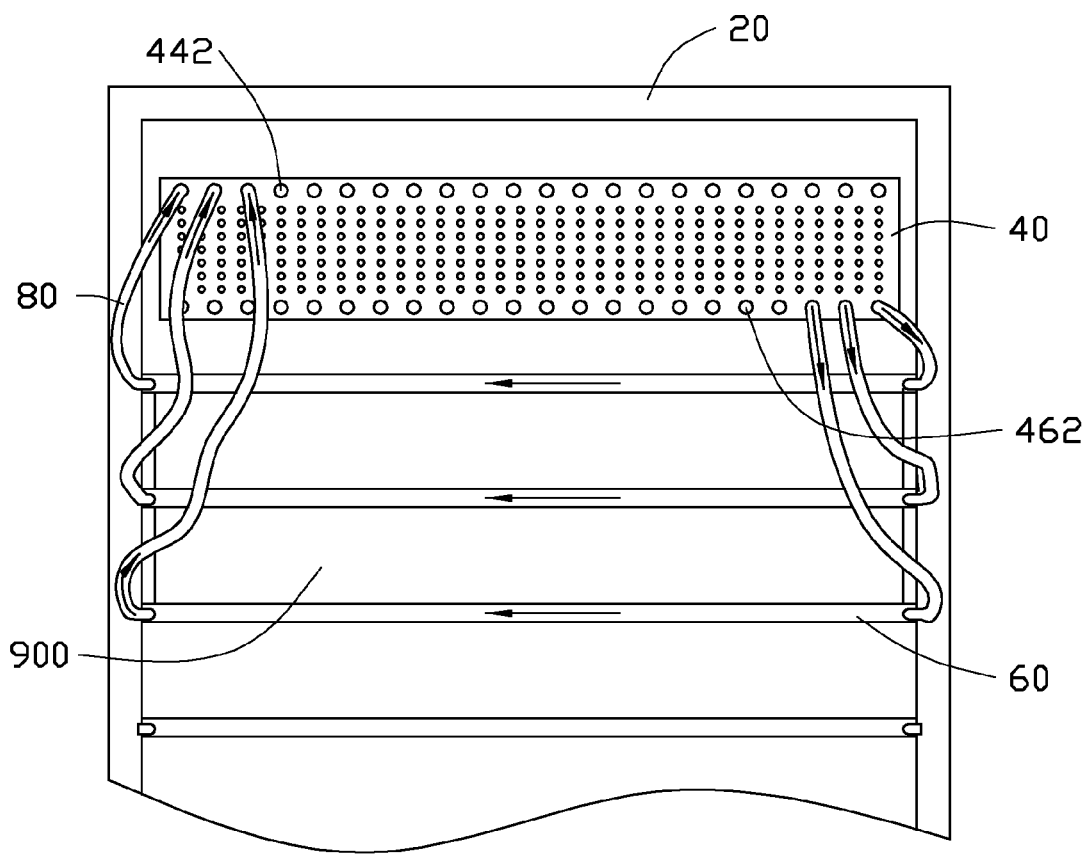
FIG. 5 is a front side plan view of FIG. 4, showing the rack-mount server in use.

FIG. 5 shows the usage. The server units 900 operate to generate a lot of heat. The heat is transferred to the water in the heat absorbing boxes 60. The water pumps 48 pump the heated water of each heat absorbing box 60 into the first water tank 44 through the water outlet connector 68, the water pipe 80 connected to the water outlet connector 68, and the inlet pipe 442. A part of heat of the heated water in the first water tank 44 is transferred to the fins 45, and the fans 47 dissipate the heat from the fins 45. The heated water in the first water tank 44 is then pumped into the second water tank 46 through the water pumps 48. Another part of heat of the heated water in the second water tank 46 is transferred to the fins 45, and the fans 47 cool the fins 45. Therefore, the heated water is cooled. The cooled water is then transferred back into the heat absorbing box 60 through the outlet pipe 462, the water pipes 80, and the water inlet connector 66. The cooled water flows along the water slot 626 of each heat absorbing box 60, to absorb heat of the server units 900. The heated water in the heat absorbing box 60 is transferred to the first water tank 44, and then the cycle repeats. Therefore, the heat dissipation system continually dissipates heat from the server units 900.

It is to be understood, however, that even though numerous characteristics and advantages of the embodiment have been set forth in the foregoing description, together with details of the structure and function of the embodiment, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A heat dissipation system, comprising:
    a heat dissipation device comprising a chassis, a first water tank received in the chassis, a second water tank receive in the chassis, a plurality of fins sandwiched between the first water tank and the second water tank, a plurality of fans aligning with the fins, and a water pump connected between the first water tank and the second water tank;
    a plurality of heat absorbing boxes each comprising a water inlet connector and a water outlet connector; and
    a plurality of water pipes;
    wherein the first water tank comprises a plurality of inlet pipes communicating with an inner space of the first water tank, the second water tank comprises a plurality of outlet pipes communicating with an inner space of the second water tank, some of the plurality of water pipes are connected between the plurality of inlet pipes of the first water tank and the plurality of water outlet connectors of the heat absorbing boxes, and the remaining water pipes are connected between the plurality of outlet pipes of the second water tank and the plurality of water inlet connectors of the corresponding heat absorbing boxes.

2. The heat dissipation system of claim 1, wherein the first water tank, the second water tank, the plurality of fins, and the plurality of heat absorbing boxes are made of heat-conductive material.

3. The heat dissipation system of claim 1, wherein the chassis comprises a front end plate defining two rows of through holes in upper and lower portions of the front end plate, the plurality of inlet pipes of the first water tank and the plurality of outlet pipes of the second water tank are inserted into the through holes of the chassis.

4. The heat dissipation system of claim 3, wherein the chassis further comprises a rear end plate defining a plurality of air ventilation areas, the plurality of fans is mounted to the rear end plate and located between the plurality of air ventilation areas and the plurality of fins.

5. The heat dissipation system of claim 4, wherein the front end plate defines a plurality of ventilation holes opposite to the plurality of air ventilation areas, the plurality of fins is located between the plurality of fans and the plurality of ventilation holes of the front end plate.

6. The heat dissipation system of claim 1, wherein the first water tank defines a water outlet opposite to the plurality of inlet pipes, the second water tank defines a water inlet opposite to the plurality of outlet pipes, the water pump is connected between the water outlet of the first water tank and the water inlet of the second water tank.

7. The heat dissipation system of claim 1, wherein each heat absorbing box comprises a shell, and a plurality of spaced partition bars extending from the shell, an end of each partition bar defines a cutout, the cutouts of every two adjacent partition bars are defined in opposite ends of the adjacent partition bars, the partition bars cooperatively bound a water slot, the water inlet connector and the water outlet connector communicate with two opposite ends of the water slot.

8. The heat dissipation system of claim 7, wherein the heat absorbing box further comprises a cover, the shell comprises a bottom plate and a flange protruding up from edges of the bottom plate, the plurality of partition bars protrudes up from the bottom plate, the water slot is bounded by the flange and the partition bars, and the cover is hermetically mounted on the flange of the shell.

9. A rack-mount server, comprising:
    a rack;
    a heat dissipation device comprising a chassis, a first water tank received in the chassis, a second water tank received in the chassis, a plurality of fins sandwiched between the first water tank and the second water tank, a plurality of fans aligning with the plurality of fins, and a water pump connected between the first water tank and the second water tank;
    a plurality of heat absorbing boxes received in the rack;
    a plurality of water pipes; and
    a plurality of server units received in the rack, wherein each server unit is sandwiched between two adjacent heat absorbing boxes;
    wherein each heat absorbing box comprising a water inlet connector and a water outlet connector, the first water tank comprises a plurality of inlet pipes, the second water tank comprises a plurality of outlet pipes, some of the water pipes are connected between the plurality of inlet pipes of the first water tank and the plurality of water outlet connectors of the heat absorbing boxes, and the remaining water pipes are connected between the plurality of outlet pipes of the second water tank and the plurality of water inlet connectors of the corresponding heat absorbing boxes.

10. The rack-mount server of claim 9, wherein the first water tank, the second water tank, the plurality of fins, and the heat absorbing boxes are made of heat-conductive material.

11. The rack-mount server of claim 9, wherein the chassis comprises a front end plate defining two rows of through holes in upper and lower portions of the front end plate, the plurality of inlet pipes of the first water tank and the plurality of outlet pipes of the second water tank are inserted into the through holes of the chassis.

12. The rack-mount server of claim 11, wherein the chassis further comprises a rear end plate defining a plurality of air ventilation areas, the plurality of fans is mounted to the rear end plate and aligns with the plurality of air ventilation areas and the plurality of fans.

13. The rack-mount server of claim 12, wherein the front end plate defines a plurality of ventilation holes opposite to the plurality of air ventilation areas, the plurality of fins is located between the plurality of fans and the plurality of ventilation holes of the front end plate.

14. The rack-mount server of claim 9, wherein the first water tank defines a water outlet opposite to the plurality of inlet pipes, the second water tank defines a water inlet opposite to the plurality of outlet pipes, the water pump is connected between the water outlet of the first water tank and the water inlet of the second water tank.

15. The rack-mount server of claim 9, wherein each heat absorbing box comprises a shell and a plurality of spaced partition bars extending from the shell, an end of each partition bar defines a cutout, the cutouts of every two adjacent partition bars are defined in opposite ends of the adjacent partition bars, the partition bars and the shell cooperatively bound a water slot, the water inlet connector and the water outlet connector communicate with two opposite ends of the water slot.

16. The rack-mount server of claim 15, wherein the heat absorbing box further comprises a cover, the shell comprises a bottom plate and a flange protruding up from edges of the bottom plate, the plurality of partition bars protrudes up from the bottom plate, the water slot is bounded by the flange and the partition bars, and the cover is hermetically mounted on the flange of the shell.

\* \* \* \* \*